(12) United States Patent
Briere (10) Patent No.: US 8,946,778 B2
(45) Date of Patent: Feb. 3, 2015

(54) ACTIVE AREA SHAPING OF III-NITRIDE DEVICES UTILIZING STEPS OF SOURCE-SIDE AND DRAIN-SIDE FIELD PLATES

(71) Applicant: International Rectifier Corporation, El Segundo, CA (US)

(72) Inventor: Michael A. Briere, Scottsdale, AZ (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 14/082,007

(22) Filed: Nov. 15, 2013

(65) Prior Publication Data
US 2014/0070280 A1 Mar. 13, 2014

Related U.S. Application Data (63) Continuation-in-part of application No. 13/965,421, filed on Aug. 13, 2013, which is a continuation of application No. 13/721,573, filed on Dec. 20, 2012, now Pat. No. 8,536,624, which is a continuation of application No. 12/008,190, filed on Jan. 9, 2008, now Pat. No. 8,338,861.

(60) Provisional application No. 60/884,272, filed on Jan. 10, 2007.

(51) Int. Cl.

| H01L 29/66 | (2006.01) |
|---|---|
| H01L 29/06 | (2006.01) |
| H01L 29/778 | (2006.01) |
| H01L 21/28 | (2006.01) |
| H01L 29/423 | (2006.01) |
| H01L 29/20 | (2006.01) |
| H01L 23/29 | (2006.01) |
| H01L 29/40 | (2006.01) |
| H01L 29/51 | (2006.01) |

(52) U.S. Cl.
CPC .......... *H01L 29/0688* (2013.01); *H01L 29/778* (2013.01); *H01L 21/28264* (2013.01); *H01L 29/42376* (2013.01); *H01L 29/66462* (2013.01); *H01L 29/7786* (2013.01); *H01L 29/2003* (2013.01); *H01L 23/291* (2013.01); *H01L 29/402* (2013.01); *H01L 29/518* (2013.01)
USPC ......................................... 257/194; 257/488

(58) Field of Classification Search
CPC .... H01L 29/788; H01L 29/404; H01L 29/778
USPC .................................................. 257/194, 488
See application file for complete search history.

(56) References Cited

U.S. PATENT DOCUMENTS

| 7,075,125 | B2 | 7/2006 | Saito | |
|---|---|---|---|---|
| 8,049,252 | B2 | 11/2011 | Smith | |
| 8,524,601 | B2 | 9/2013 | Kurahashi | |
| 2007/0018199 | A1 | 1/2007 | Sheppard | |
| 2009/0189187 | A1 | 7/2009 | Briere | |
| 2011/0057257 | A1* | 3/2011 | Park et al. | 257/330 |
| 2012/0223319 | A1 | 9/2012 | Dora | |
| 2012/0267687 | A1* | 10/2012 | Jeon et al. | 257/194 |

* cited by examiner

*Primary Examiner* — Mark Prenty
(74) *Attorney, Agent, or Firm* — Farajami & Farajami LLP (57) ABSTRACT

In an exemplary implementation, a III-nitride semiconductor device includes a III-nitride heterojunction including a first III-nitride body situated over a second III-nitride body to form a two-dimensional electron gas. The III-nitride semiconductor device further includes a gate well formed in a dielectric body, the dielectric body situated over the III-nitride heterojunction. A gate arrangement is situated in the gate well and includes a gate electrode, a source-side field plate, and a drain-side field plate. The source-side field plate and the drain-side field plate each include one or more steps, where the drain-side field plate has a different number of the one or more steps than the source-side field plate.

19 Claims, 10 Drawing Sheets

ACTIVE AREA SHAPING OF III-NITRIDE DEVICES UTILIZING STEPS OF SOURCE-SIDE AND DRAIN-SIDE FIELD PLATES

The present application is a continuation-in-part of U.S. patent application Ser. No. 13/965,421, filed on Aug. 13, 2013, which itself is a continuation of U.S. patent application Ser. No. 13/721,573, filed on Dec. 20, 2012, which in turn is a continuation of U.S. patent application Ser. No. 12/008,190, filed on Jan. 9, 2008, which claims priority to U.S. provisional application 60/884,272, filed on Jan. 10, 2007. The present application claims the benefit of and priority to all of the above-identified applications; and the disclosures of all of the above-identified applications are hereby fully incorporated by reference into the present application.

BACKGROUND

I. Definitions

As used herein, the phrase "group III-V" refers to a compound semiconductor including at least one group III element and at least one group V element. By way of example, a group III-V semiconductor may take the form of a III-Nitride semiconductor. "III-Nitride", or "III-N", refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar, or non-polar crystal orientations. A III-Nitride material may also include either the Wurtzitic, Zincblende, or mixed polytypes, and may include single-crystal, monocrystalline, polycrystalline, or amorphous structures. Gallium nitride or GaN, as used herein, refers to a III-Nitride compound semiconductor wherein the group III element or elements include some or a substantial amount of gallium, but may also include other group III elements in addition to gallium.

II. Background Art

A III-nitride heterojunction semiconductor device can include a III-nitride heterojunction having a first III-nitride body of one bandgap and a second III-nitride body of another bandgap formed over the first III-nitride body. The composition of the first and second III-nitride bodies are selected to cause the formation of a carrier rich region referred to as a two-dimensional electron gas (2DEG) at or near the III-nitride heterojunction. The 2DEG can serve as a conduction channel between a first power electrode (e.g. a source electrode) and a second power electrode (e.g. a drain electrode).

The III-nitride heterojunction semiconductor device can also include a gate electrode disposed between the first and second power electrodes to selectively interrupt or restore the 2DEG therebetween, whereby the device may be operated as a switch. The gate electrode may be received by a trench that extends through a passivation body. The trench in which the gate electrode is received includes vertical sidewalls that form sharp bottom corners in the gate electrode. This can result in high electric field regions at the bottom corners of the gate electrode, as well as an increase in the overlap between the gate electrode and the 2DEG.

SUMMARY

Active area shaping of III-nitride devices utilizing steps of source-side and drain-side field plates, substantially as shown in and/or described in connection with at least one of the figures, and as set forth more completely in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1A:
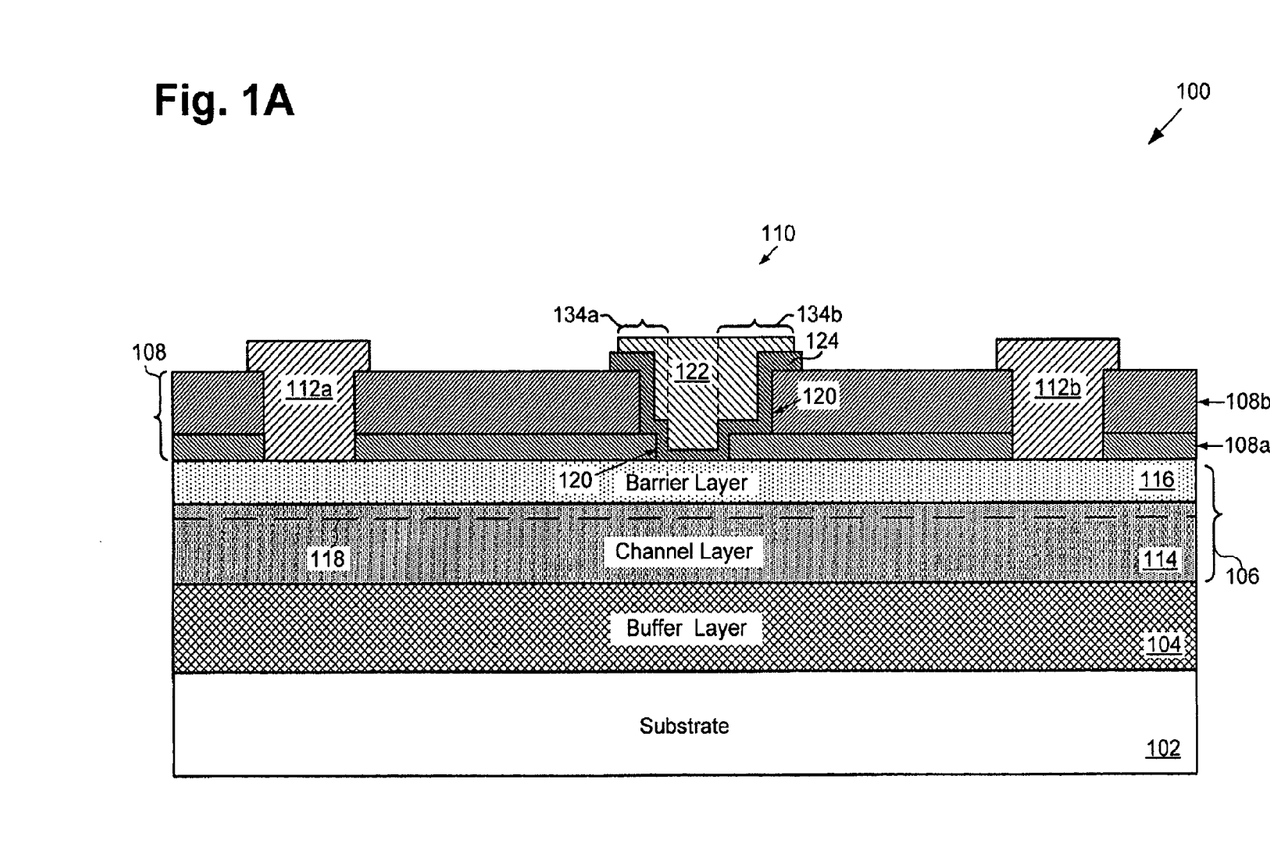
FIG. 1A presents a cross-sectional view of a portion of an exemplary III-nitride semiconductor device, in accordance with one implementation of the present disclosure.

FIG. 1A presents a cross-sectional view of a portion of an exemplary III-nitride semiconductor device, in accordance with one implementation of the present disclosure.

In FIG. 1A, semiconductor device 100 is a transistor (e.g. a high-electron-mobility transistor), and may be an enhancement mode or depletion mode transistor. III-nitride semiconductor device 100 includes substrate 102, buffer layer 104, III-nitride heterojunction 106, dielectric body 108, gate arrangement 110, and ohmic electrodes 112a and 112b.

In the present implementation, buffer layer 104 includes AlN, by way of example, and is formed over substrate 102. Substrate 102 is a silicon substrate in the present implementation, however other substrate materials can be utilized. III-nitride semiconductor device 100 can include other layers not specifically shown in FIG. 1A, such as transition layers configured to manage stress between substrate 102 and III-nitride body 114. Other examples include spacer layers and cap layers.

III-nitride heterojunction 106 is formed over buffer layer 104 and includes III-nitride body 116 situated over III-nitride body 114 to form a two-dimensional electron gas (2DEG) 118. III-nitride body 114 may also be referred to as a channel layer and III-nitride body 116 may also be referred to as a barrier layer, as shown in FIG. 1A. The composition of III-nitride bodies 114 and 116 are selected to cause formation 2DEG 118, which is rich in carriers and forms a conduction channel between ohmic electrodes 112a and 112b. III-nitride body 114 includes semiconductor material of one bandgap, and III-nitride body 116 includes semiconductor material of another bandgap. In the present implementation, III-nitride body 114 includes GaN and III-nitride body 116 includes AlGaN. However, other semiconductor materials may be utilized, such as other group III-V semiconductor materials (e.g. III-Nitride materials).

Also in FIG. 1A, ohmic electrodes 112a and 112b are ohmically coupled to III-nitride body 116 and are thereby electrically coupled to 2DEG 118. Ohmic electrodes 112a and 112b extend through dielectric body 108 to contact III-nitride body 116. As shown, ohmic electrodes 112a and 112b are optionally situated in respective trenches in dielectric body 108. In III-nitride semiconductor device 100, ohmic electrode 112a is a source electrode and ohmic electrode 112b is a drain electrode.

Also in the present implementation, dielectric body 108 is situated over III-nitride heterojunction 106 and includes dielectric layer 108a of a first dielectric material and dielectric layer 108b of a second dielectric material different than the first dielectric material. Dielectric body 108 is configured to passivate III-nitride body 116. As such, dielectric body 108 can be referred to as a passivation body in some implementations. In one implementation, dielectric layer 108a is an oxide and dielectric layer 108b is a nitride. In another implementation, dielectric layer 108a is a nitride and dielectric layer 108b is an oxide. Silicon Oxide ($SiO_2$) is an example of a material suitable for the oxide and silicon nitride ($Si_xN_y$) is an example of a material suitable for the nitride. Although not shown in FIG. 1A, dielectric body 108 can include one or more additional dielectric layers. The one or more additional dielectric layers can be of a third dielectric material different than the first or second dielectric materials. However, in one implementation, an additional dielectric layer is situated over dielectric layer 108b and is of the first dielectric material. In some implementations, dielectric body 108 alternates between dielectric layers of the first and second dielectric materials.

Figure 1B:
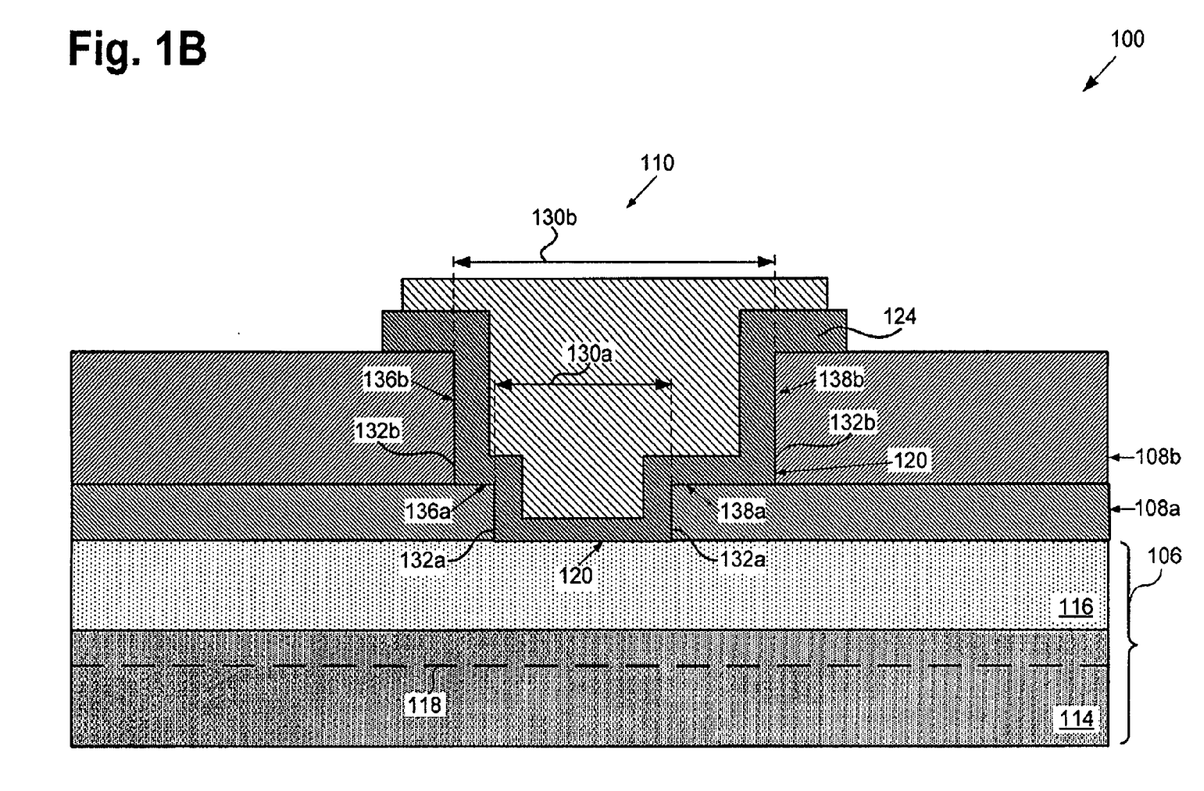
FIG. 1B presents an enhanced cross-sectional view of a portion of an exemplary III-nitride semiconductor device, in accordance with one implementation of the present disclosure.

Gate well 120 is defined by dielectric body 108 and extends through dielectric body 108 to contact III-nitride layer 116. As shown, gate well 120 is formed in dielectric body 108 and is defined by dielectric layers 108a and 108b of dielectric body 108. Referring now to FIG. 1B, FIG. 1B presents an enhanced cross-sectional view of the portion of the exemplary III-nitride semiconductor device shown in FIG. 1A. FIG. 1B shows gate well 120 being of width 130a defined by dielectric layer 108a, and being of width 130b defined by dielectric layer 108b.

As shown in FIG. 1B, width 130a is defined by opening 132a in dielectric layer 108a. Furthermore, width 130b is defined by opening 132b in dielectric layer 108b. It is noted that in some implementations, dielectric body 108 can be a single dielectric layer and openings opening 132a and 132b can be in the single layer. Furthermore, dielectric body 108 may include additional dielectric layers, such that any of openings 132a and 132b can be in multiple dielectric layers.

In the present implementation, ledges 136a and 138a of dielectric layer 108a define width 130a of gate well 120 as well as opening 132a. Also, sidewalls 136b and 138b of dielectric layer 108b define width 130b of gate well 120 as well as opening 132b. Width 130b is greater than width 130a, such, that gate well 120 expands in width away from III-nitride heterojunction 106. Thus, opening 132b in dielectric layer 108b is wider than opening 132a in dielectric layer 108a.

Gate arrangement 110 includes gate electrode 122 situated in gate well 120. Gate electrode 122 is disposed between ohmic electrodes 112a and 112b and is configured to selectively modulate 2DEG 118, whereby III-nitride semiconductor device 100 may be operated as a switch. Gate electrode 122 can make Schottky contact with III-nitride heterojunction 106. However, in the present implementation, gate arrangement 110 includes gate dielectric 124, such that gate electrode 122 makes capacitive contact with III-nitride heterojunction 106. Gate dielectric 124 is situated in and lines gate well 120. Suitable materials for gate dielectric 124 include silicon nitride ($Si_xN_y$) and/or other suitable gate dielectric material or materials.

In gate arrangement 110, gate electrode 122 is integrated with at least one field plate. For example, FIG. 1A shows gate electrode 122 as being integrated with field plates 134a and 134b. Field plates 134a and 134b are situated over dielectric layer 108a. Gate dielectric 124 and/or any of field plates 134a and 134b can optionally extend out from gate well 120, as shown in FIGS. 1A and 1B. Thus, as shown, field plates 134a and 134b are also situated over dielectric layer 108b. Also, a side of gate well 120 without a corresponding field plate may be substantially parallel to an adjacent side of gate electrode 122, as no ledge is required.

Field plate 134a is situated between gate electrode 122 and ohmic electrode 112a, which is a source electrode. Thus, field plate 134a may be referred to as a source-side field plate. Field plate 134b is situated between gate electrode 122 and ohmic electrode 112b, which is a drain electrode. Thus, field plate 134b may be referred to as a drain-side field plate. It is noted that various implementations may include only one of field plates 134a and 134b.

Gate electrode 122 is situated in opening 132a in dielectric layer 108a, and field plates 134a and 134b are situated in opening 132b in dielectric layer 108b. In the implementation shown, gate arrangement 110 fills opening 132a in dielectric layer 108a and opening 132b in dielectric layer 108b. More particularly, gate electrode 122, field plates 134a and 134b, and optionally gate dielectric 124 collectively fill gate well 120. By integrating field plates 134a and 134b with gate electrode 122, overlap between gate electrode 122 and 2DEG 118 can be decreased thereby reducing gate-drain charge (Qgd) for III-nitride semiconductor device 100. Furthermore, field plates 134a and 134b alleviate high electric fields that would otherwise form from sharp corners of gate electrode 122, thereby increasing breakdown voltage of III-nitride semiconductor device 100.

In some implementations, one of the ledges, for example, ledge 138a that is closer to ohmic electrode 112b (e.g. a drain electrode) may be wider than ledge 136a, which is closer to ohmic electrode 112a (e.g. a source electrode). The width of each ledge is in the lateral dimension inside gate well 120. Doing so can further improve breakdown voltage of III-nitride semiconductor device 100. Ledge 138a can be between approximately 2 to approximately 4 times as wide as ledge 136a, by way of example. In the implementation shown, ledge 136a is approximately 0.025 µm wide and ledge 138a is between approximately 0.05 µm to 0.1 µm wide. As a result, field plate 134b may be wider than field plate 134a, as shown. The portion of field plate 134b over only dielectric layer 108a of dielectric body 108 is wider than the portion of field plate 134a over only dielectric layer 108a of dielectric body 108. However, the portion of field plate 134b over both dielectric layers 108a and 108b can also be wider than the portion of field plate 134a over both dielectric layers 108a and 108b.

Figure 2:
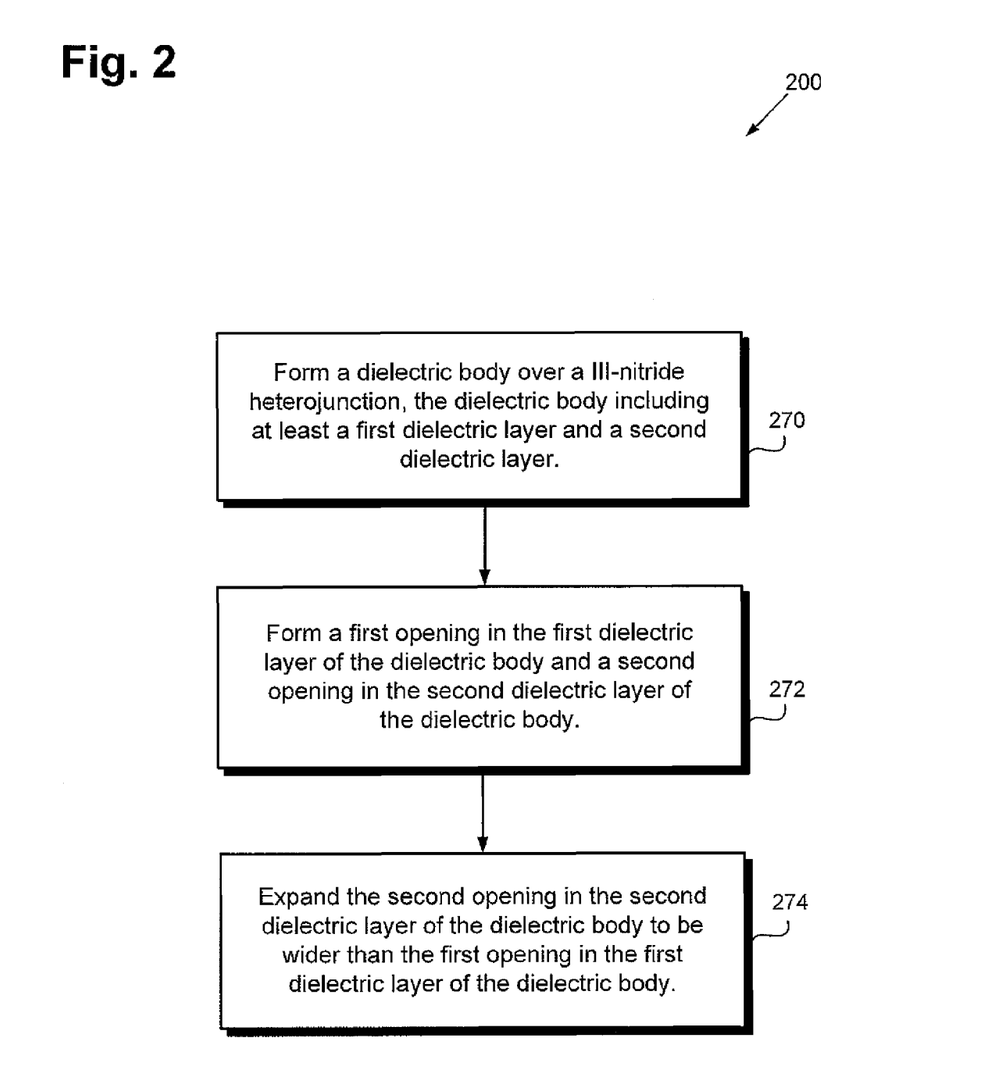
FIG. 2 shows a flowchart illustrating an exemplary method for fabricating a III-nitride semiconductor device, in accordance with one implementation of the present disclosure.

FIG. 2 shows a flowchart illustrating an exemplary method for fabricating a III-nitride semiconductor device, in accordance with one implementation of the present disclosure. The approach and technique indicated by flowchart 200 are sufficient to describe at least one implementation of the present disclosure, however, other implementations of the disclosure may utilize approaches and techniques different from those shown in flowchart 200. Furthermore, while flowchart 200 is described with respect to FIGS. 3A, 3B, and 3C, disclosed inventive concepts are not intended to be limited by specific features shown and described with respect to FIGS. 3A, 3B, and 3C. Furthermore, with respect to the method illustrated in FIG. 2, it is noted that certain details and features have been left out of flowchart 200 in order not to obscure discussion of inventive features in the present application. Furthermore, implementations illustrated by flowchart 200 are performed on a processed wafer, which, includes, amongst other things, a substrate, a III-nitride heterojunction, and a buffer layer, and or other features, such as transition layers and/or spacer layers. The wafer may also be referred to as a semiconductor die or simply a die in the present application.

Figure 3A:
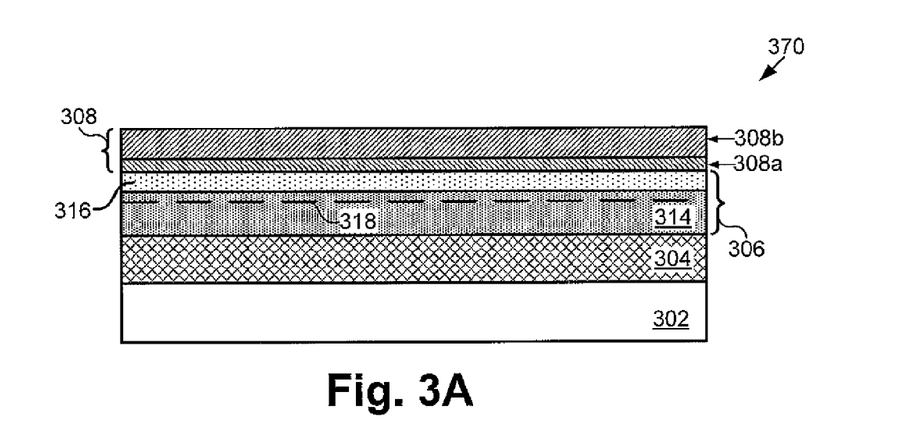
FIG. 3A illustrates a cross-sectional view, which includes a portion of an exemplary wafer processed according to an implementation disclosed in the present application.

Referring now to flowchart 200 of FIG. 2 and FIG. 3A, flowchart 200 includes forming a dielectric body over a III-nitride heterojunction, the dielectric body including at least a first dielectric layer and a second dielectric layer (270 in FIG. 2). As shown in FIG. 3A, structure 370 includes substrate 302, buffer layer 304, III-nitride heterojunction 306, and dielectric body 308 corresponding respectively to substrate 102, buffer layer 104, III-nitride heterojunction 106, and dielectric body 108 in FIGS. 1A and 1B during fabrication of III-nitride semiconductor device 100. III-nitride heterojunction 306 includes III-nitride bodies 314 and 316 corresponding respectively to III-nitride bodies 114 and 116 in FIGS. 1A and 1B during fabrication of III-nitride semiconductor device 100.

In forming structure 370, buffer layer 304, such as AlN, can be grown over substrate 302 such as a silicon substrate, a silicon carbide substrate, a sapphire substrate, or the like. Buffer layer 304 may not be necessary if substrate 302 is compatible with III-nitride body 314. As one example, buffer layer 304 may not be necessary if substrate 302 is a GaN substrate. After buffer layer 304 is formed, III-nitride body 314, for example, GaN, can be grown over buffer layer 304, followed by growth of III-nitride body 316, for example, AlGaN, to obtain 2DEG 318, corresponding to 2DEG 118 in FIGS. 1A and 1B.

Thereafter, dielectric body 308 is formed over III-nitride heterojunction 306, buffer layer 304, and substrate 302. Dielectric body 308 includes at least dielectric layer 308a and dielectric layer 308b corresponding respectively to dielectric layer 108a and dielectric layer 108b in FIGS. 1A and 1B during fabrication of III-nitride semiconductor device 100. Forming dielectric body 308 can include growing or depositing dielectric layer 308a of a first dielectric material over III-nitride heterojunction 306 and growing or depositing dielectric layer 308b of a second dielectric material over dielectric layer 308a.

The first and second dielectric materials can optionally be different dielectric materials, such as in the present implementation. For example, the first and second dielectric materials can be selected such that an enchant capable of removing portions of dielectric layer 308b does not remove portions of dielectric layer 308a (i.e. the enchant is selective to dielectric layer 308b). Examples of suitable materials for dielectric layer 308a include field dielectrics, such as AlN and $Si_xN_y$. Dielectric layer 308a can be approximately 0.05 µm to approximately 0.1 µm thick, by way of example.

Figure 3B:
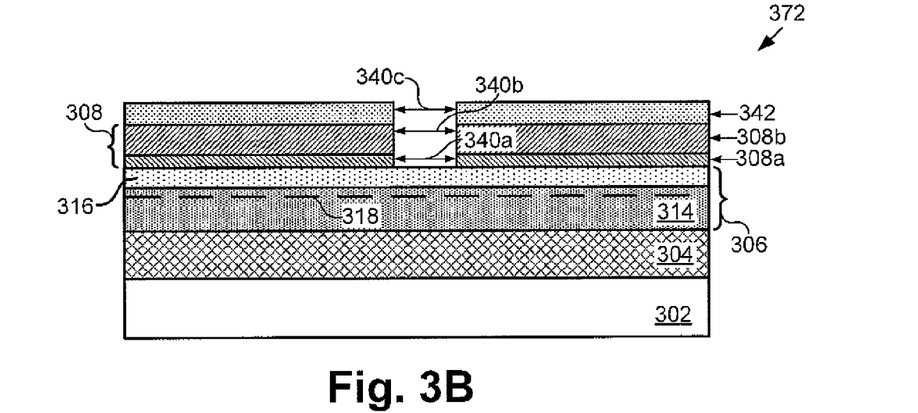
FIG. 3B illustrates a cross-sectional view, which includes a portion of an exemplary wafer processed according to an implementation disclosed in the present application.

Referring now to flowchart 200 of FIG. 2 and FIG. 3B, flowchart 200 includes forming a first opening in the first dielectric layer of the dielectric body and a second opening in the second dielectric layer of the dielectric body (272 in FIG. 2). As shown in FIG. 3B, structure 372 includes opening 340a in dielectric layer 308a and opening 340b in dielectric layer 308b.

In forming structure 372, mask 342 (e.g. a photoresist mask) can be deposited over dielectric body 308 of structure 370. Mask 342 can be patterned (e.g. utilizing photolithography) to form opening 340c over dielectric body 308. Thereafter, openings 340a and 340b can be formed in dielectric layers 308a and 308b by etching through dielectric layers 308a and 308b. The etch is isotropic in some implementations. Thus, openings 340a and 340b may form substantially vertical sidewalls in dielectric body 308, as shown.

Figure 3C:
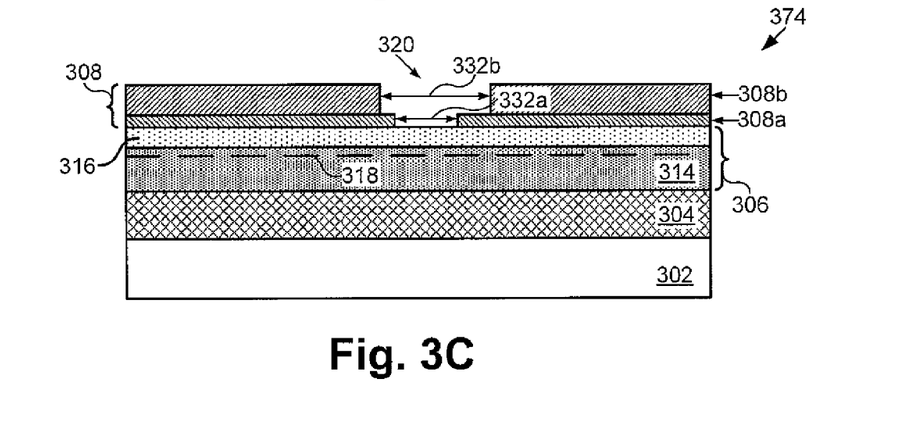
FIG. 3C illustrates a cross-sectional view, which includes a portion of an exemplary wafer processed according to an implementation disclosed in the present application.

Referring now to flowchart 200 of FIG. 2 and FIG. 3C, flowchart 200 includes expanding the second opening in the second dielectric layer of the dielectric body to be wider than the first opening in the first dielectric layer of the dielectric body (274 in FIG. 2). As shown in FIG. 3B, structure 374 opening 332b in dielectric layer 308b of dielectric body 308 is wider than and opening 332a in dielectric layer 308a of dielectric body 308.

In forming structure 374, mask 342 can be removed from structure 372, and a second mask and a second etch can be utilized to remove portions of dielectric layer 308b from the substantially vertical sidewalls formed in dielectric body 308. In doing so, gate well 320 can be formed corresponding to gate well 120 in FIGS. 1A and 1B. Thus, openings 332a and 332b can correspond respectively to openings 132a and 132b in FIGS. 1A and 1B. Subsequently, gate dielectric 124, gate electrode 122, and ohmic electrodes 112a and 112b may be formed so as to result in III-nitride semiconductor device 100 in FIGS. 1A and 1B. The second mask can be offset from the center opening 340c in mask 342 so that one of ledges 136a and 138a is wider than the other of ledges 136a and 138a.

As dielectric layer 308a includes a first dielectric material that is different than a second dielectric material of dielectric layer 308b, the second etch can be selective to dielectric layer 308b. As such, opening 340a of FIG. 3B can be substantially identical to opening 332a of FIG. 3C.

As an alternative, a single etch may be performed on structure 370 of FIG. 3A by utilizing an enchant, which etches dielectric layers 308a and 308b at different rates (i.e. etches dielectric layer 308b faster than dielectric layer 308a) to obtain structure 374 of FIG. 3C. As dielectric layer 308a includes a first dielectric material that is different than a second dielectric material of dielectric layer 308b, the single etch can occur at different rates on dielectric layers 308a and 308b. As such, the second mask and etch may be avoided. Thus, it will be appreciated that 272 and 274 in flowchart 200 of FIG. 2 can be concurrent, in some implementations. Such implementations may still include forming mask 342 of FIG. 3B with opening 340c, as described above.

Figure 4:
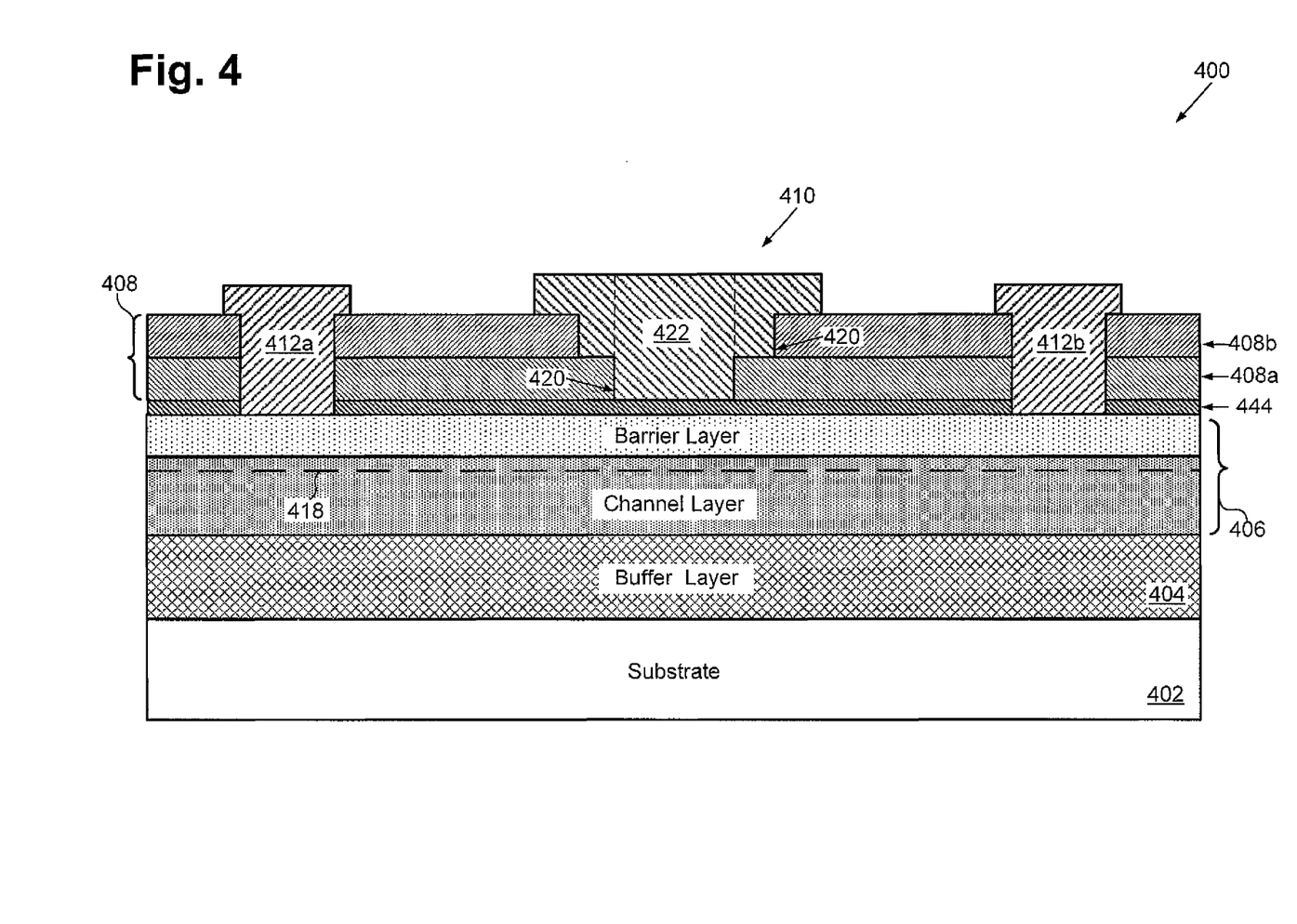
FIG. 4 presents a cross-sectional view of a portion of an exemplary III-nitride semiconductor device, in accordance with one implementation of the present disclosure.

While in implementations described above gate dielectric 124 is formed in gate well 120, in other implementations, gate well 120 is formed over gate dielectric 124. Referring now to FIG. 4, FIG. 4 presents a cross-sectional view of a portion of an exemplary III-nitride semiconductor device, in accordance with one implementation of the present disclosure.

In III-nitride semiconductor device 400, substrate 402, buffer layer 404, III-nitride heterojunction 406, dielectric body 408, ohmic electrodes 412a and 412b, gate well 420, and gate electrode 422 correspond respectively to buffer layer 104, III-nitride heterojunction 106, dielectric body 108, ohmic electrodes 112a and 112b, gate well 120, and gate electrode 122 in FIGS. 1A and 1B. Thus, III-nitride semiconductor device 400 can be similar to III-nitride semiconductor device 100 in FIGS. 1A and 1B. However, in gate arrangement 410 of III-nitride semiconductor device 400, gate dielectric 444 is situated below gate well 420. As one example, III-nitride semiconductor device 400 can be fabricated similar to III-nitride semiconductor device 100 by forming gate dielectric 444 over III-nitride heterojunction 406 prior to 270 in flowchart 200 of FIG. 2.

FIGS. 1A, 1B, 2, 3A, 3B, 3C, and 4 describe implementations in which a gate well is defined by two openings in a dielectric body. In doing so, a field plate can have a step defined in the dielectric body. However, the gate well can be defined by more than two openings in the dielectric body, an example of which is shown and described below with respect to FIGS. 5A and 5B. Doing so can provide for a field plate having additional steps defined by the dielectric body, which allows for enhanced active area shaping of a III-nitride semiconductor device.

Figure 5A:
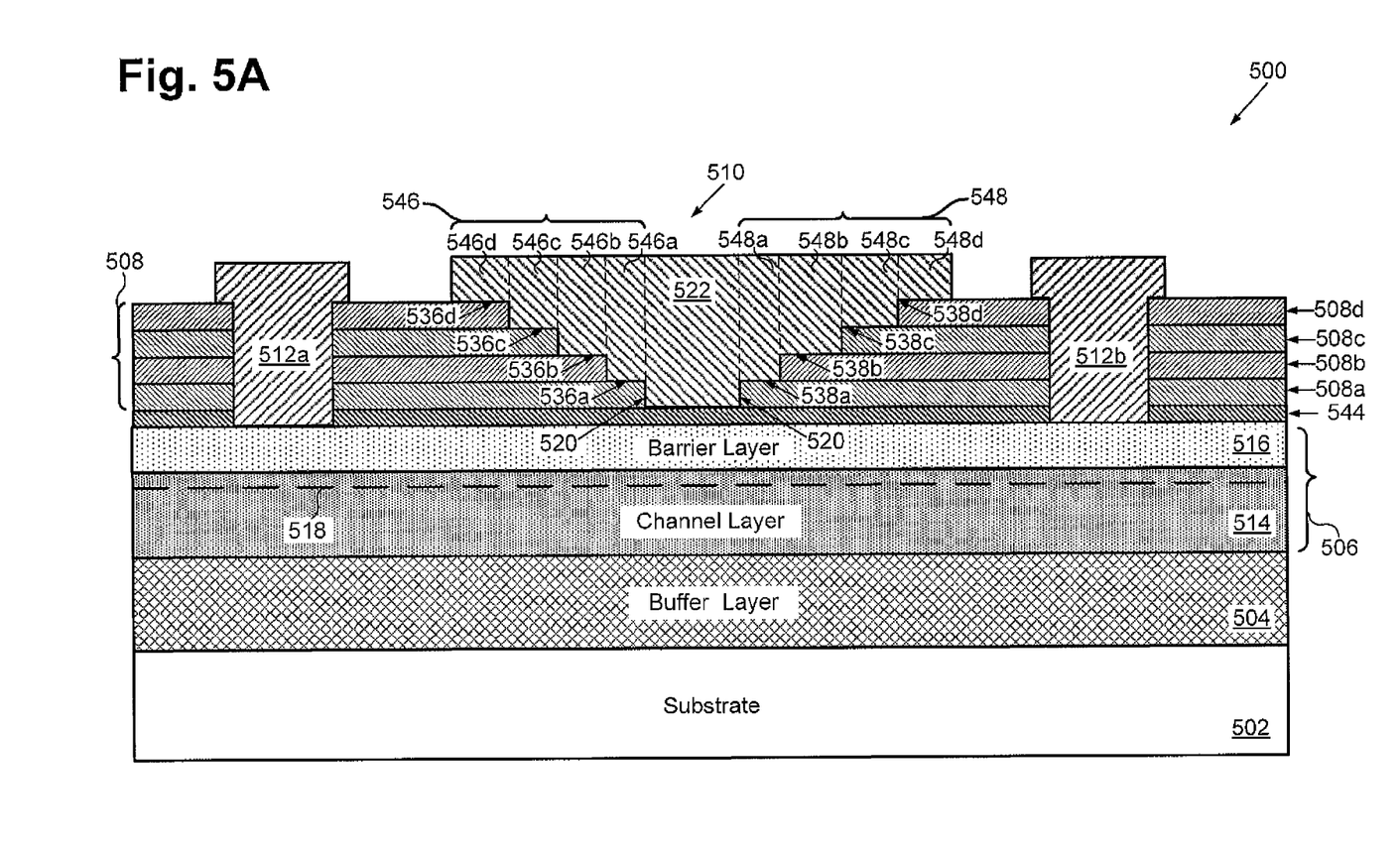
FIG. 5A presents a cross-sectional view of a portion of an exemplary III-nitride semiconductor device, in accordance with one implementation of the present disclosure.
Figure 5B:
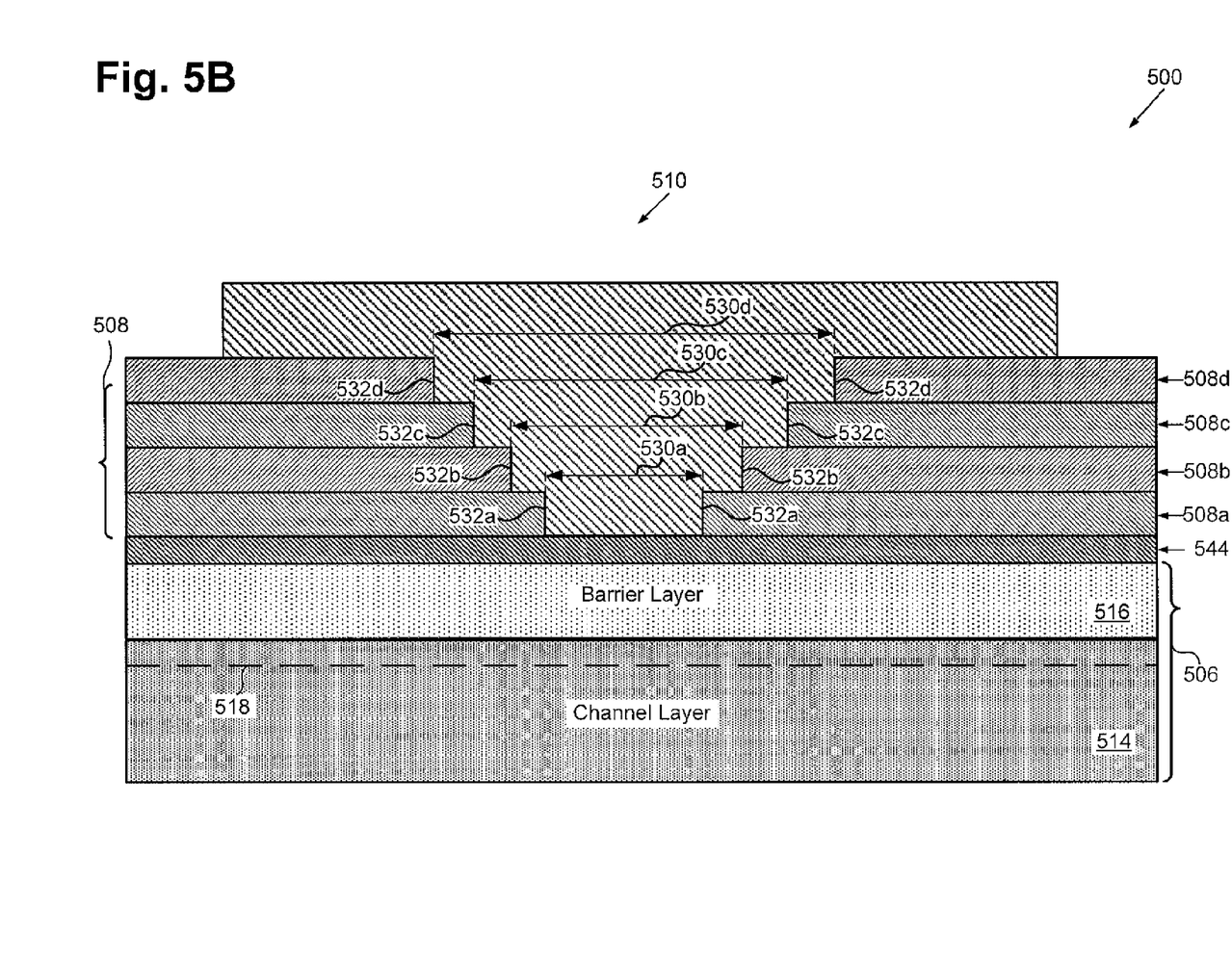
FIG. 5B presents an enhanced cross-sectional view of a portion of an exemplary III-nitride semiconductor device, in accordance with one implementation of the present disclosure.

FIG. 5A presents a cross-sectional view of a portion of an exemplary III-nitride semiconductor device, in accordance with one implementation of the present disclosure. FIG. 5B presents an enhanced cross-sectional view of the portion of the exemplary III-nitride semiconductor device of FIG. 5A. In FIGS. 5A and 5B, III-nitride semiconductor device 500 includes substrate 502, buffer layer 504, III-nitride heterojunction 506, dielectric body 508, gate arrangement 510, ohmic electrodes 512a and 512b, and gate well 520 corresponding respectively to substrate 102, buffer layer 104, III-nitride heterojunction 106, dielectric body 108, gate arrangement 110, ohmic electrodes 112a and 112b, and gate well 120 in FIGS. 1A and 1B.

III-nitride heterojunction 506 is formed over buffer layer 504 and includes III-nitride body 516 situated over III-nitride body 514 to form a two-dimensional electron gas (2DEG) 518. III-nitride bodies 514 and 516 and 2DEG 518 correspond respectively to III-nitride bodies 114 and 116 and 2DEG 118 in FIGS. 1A and 1B.

Gate arrangement 510 includes gate electrode 522 and field plates 546 and 548 corresponding respectively to gate electrode 122 and field plates 134a and 134b in FIGS. 1A and 1B.

Thus, field plate 546 is a source-side field plate and field plate 548 is a drain-side field plate. Gate arrangement 510 also includes gate dielectric 544 corresponding to gate dielectric 444 in FIG. 4. While gate dielectric 544 is situated below gate well 520, similar to gate dielectric 444 in FIG. 4, in other implementations, gate dielectric 544 can be situated in and line gate well 520, similar to gate dielectric 124 in FIGS. 1A and 1B.

In III-nitride semiconductor device 500, dielectric body 508 includes dielectric layers 508a, 508b, 508c, and 508d (i.e. a plurality of dielectric layers). In other implementations, dielectric body 508 may include more or fewer dielectric layers. Dielectric layers 508a and 508b can correspond to dielectric layers 108a and 108b in dielectric body 108 of III-nitride semiconductor device 100. Thus, dielectric body 508 can include, for example, at least one silicon nitride layer and at least one silicon oxide layer. Dielectric layers 508c and 508d can be any suitable dielectric material, such as those described with respect to dielectric layers 108a and 108b.

In some implementations, dielectric layer 508c is of the same dielectric material as dielectric layer 508a and dielectric layer 508d is of the same dielectric material as dielectric layer 508b. In other implementations, dielectric layers 508a, 508b, 508c, and 508d are different dielectric materials from one another. Thus, in some implementations, gate well 520 may be formed utilizing an enchant, which etches any of dielectric layers 508a, 508b, 508c, and 508d at different rates from others of dielectric layers 508a, 508b, 508c, and 508d, such as has been described with respect to flowchart 200. However, one or more masks may be utilized to define the width of any of dielectric layers 508a, 508b, 508c, and 508d as well.

Referring to FIG. 5B, field plate 546 includes steps 546a, 546b, 546c, and 546d defined by dielectric body 508. Field plate 548 includes steps 548a, 548b, 548c, and 548d defined by dielectric body 508. By including field plates having at least two steps defined by a dielectric body, III-nitride semiconductor device 500 can achieve enhanced active area shaping including well-defined electric fields.

Referring to FIG. 5A with FIG. 5B, steps 546a, 546b, 546c, and 546d of field plate 546 are defined by openings 532a, 532b, 532c, and 532d in dielectric layers 508a, 508b, 508c, and 508d. Steps 548a, 548b, 548c, and 548d of field plate 548 are also defined by openings 532a, 532b, 532c, and 532d in dielectric layers 508a, 508b, 508c, and 508d. Each step may be defined by a respective opening in dielectric body 508, as shown. For example, step 546a is defined by opening 530b.

Steps 546a, 546b, 546c, and 546d of field plate 546 are respectively situated on ledges 536a, 536b, 536c, and 536d of dielectric body 508. Furthermore, steps 546a, 546b, 546c, and 546d of field plate 546 are defined by ledges 536a, 536b, 536c, and 536d of dielectric body 508. Similarly, steps 548a, 548b, 548c, and 548d of field plate 548 are respectively situated on ledges 538a, 538b, 538c, and 538d of dielectric body 508. Also, steps 548a, 548b, 548c, and 548d of field plate 548 are defined by ledges 538a, 538b, 538c, and 538d of dielectric body 508. Each step may be defined by a respective ledge of dielectric body 508, as shown. For example, step 548a is defined by ledge 536b of dielectric body 508. Although not shown in FIGS. 5A and 5B field plate 548 may be wider than field plate 546, similar to what is shown in FIGS. 1A and 1B. This may be accomplished where any of ledges 536a, 536b, 536c, and 536d are wider than any of ledges 538a, 538b, 538c, and 538d.

Gate well 520 is of width 530a defined by dielectric layer 508a, width 530b defined by dielectric layer 508b, width 530c defined by dielectric layer 508c, and width 530d defined by dielectric layer 508d. Width 530b is greater than width 530a, width 530c is greater than width 530b, and width 530d is greater than width 530c, such that gate well 520 expands in width away from III-nitride heterojunction 506. As gate arrangement 510 fills gate well 520, gate arrangement 510 also expands away from III-nitride heterojunction 506 so as to ease electric fields thereunder.

Figure 6A:
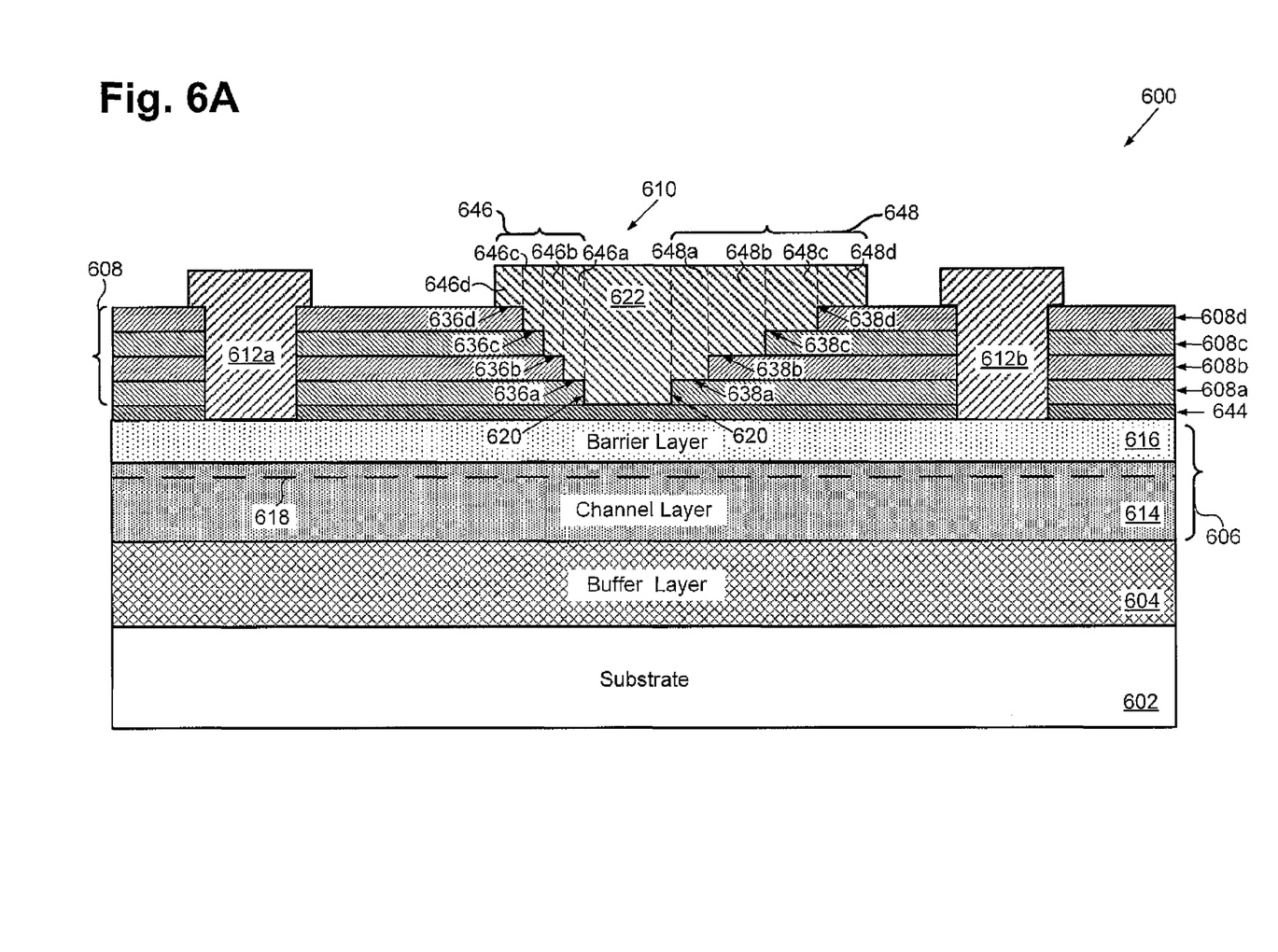
FIG. 6A presents a cross-sectional view of a portion of an exemplary III-nitride semiconductor device, in accordance with one implementation of the present disclosure.
Figure 6B:
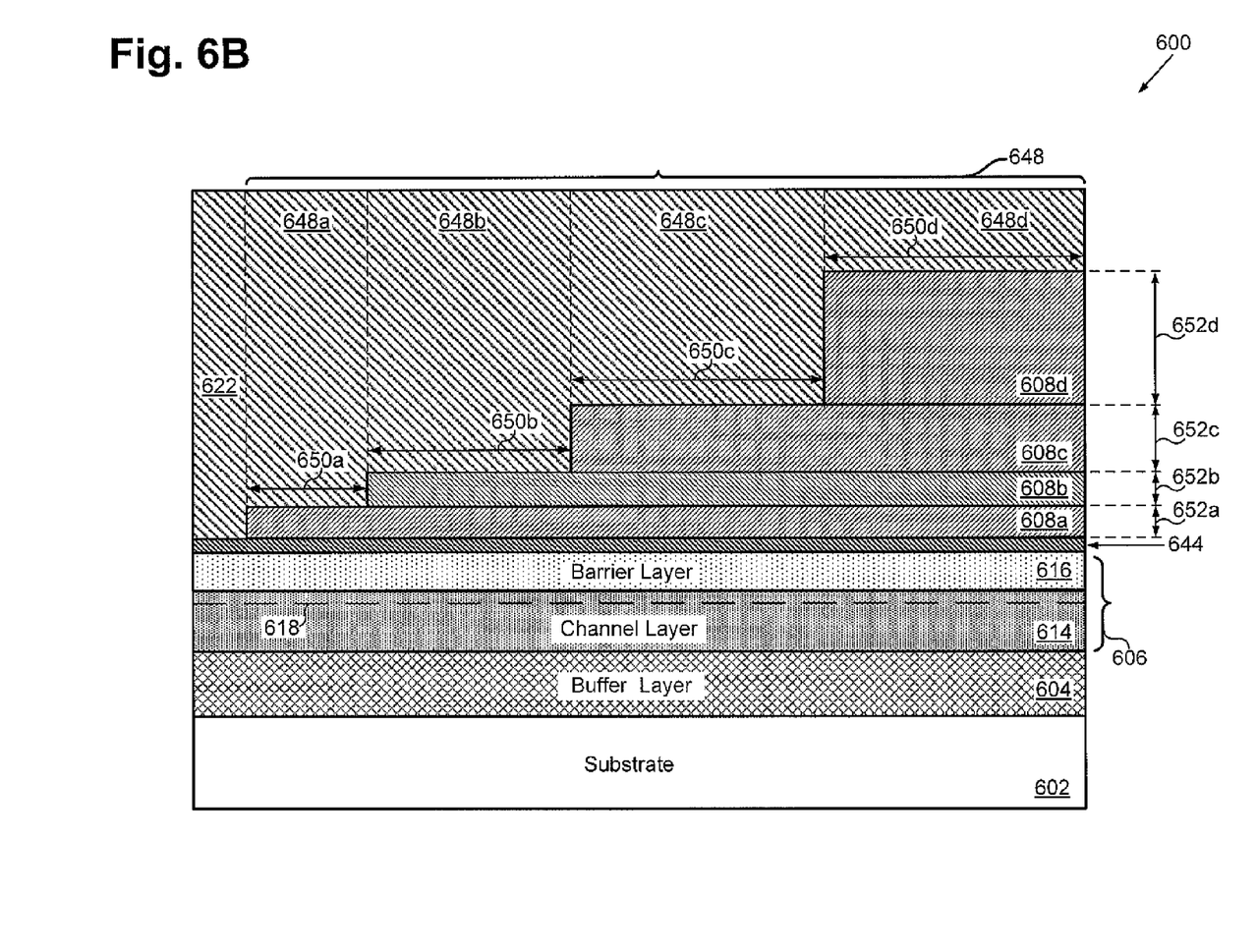
FIG. 6B presents an enhanced cross-sectional view of a portion of an exemplary III-nitride semiconductor device, in accordance with one implementation of the present disclosure.

In FIGS. 5A and 5B, source-side field plate 546 and drain-side field plate 548 are substantially symmetrical. However, in various implementations, any of the source-side and drain-side field plates described herein may be asymmetrical with respect to one another. This may be accomplished by configuring the widths of steps of a field plate, such as steps 548a, 548b, 548c, and 548d of drain-side field plate 548. FIGS. 6A and 6B illustrate one example of a III-nitride semiconductor device having asymmetrical source-side and drain-side field plates. FIG. 6A presents a cross-sectional view of a portion of an exemplary III-nitride semiconductor device, in accordance with one implementation of the present disclosure. FIG. 6B presents an enhanced cross-sectional view of the portion of an exemplary III-nitride semiconductor device, in accordance with one implementation of the present disclosure.

In FIGS. 6A and 6B, III-nitride semiconductor device 600 includes substrate 602, buffer layer 604, III-nitride heterojunction 606, dielectric body 608, gate arrangement 610, ohmic electrodes 612a and 612b, and gate well 620 corresponding respectively to substrate 502, buffer layer 504, III-nitride heterojunction 506, dielectric body 508, gate arrangement 510, ohmic electrodes 512a and 512b, and gate well 520 in FIGS. 5A and 5B.

III-nitride heterojunction 606 is formed over buffer layer 604 and includes III-nitride body 616 situated over III-nitride body 614 to form a two-dimensional electron gas (2DEG) 618. III-nitride bodies 614 and 616 and 2DEG 618 correspond respectively to III-nitride bodies 514 and 516 and 2DEG 518 in FIGS. 5A and 5B.

Dielectric body 608 includes dielectric layers 608a, 608b, 608c, and 608d corresponding respectively to dielectric layers 508a, 508b, 508c, and 508d in dielectric body 508. Dielectric body 608 also includes ledges 636a, 636b, 636c, and 636d corresponding respectively to ledges 536a, 536b, 536c, and 536d of dielectric body 508. Dielectric body 608 further includes ledges 638a, 638b, 638c, and 638d corresponding respectively to ledges 538a, 538b, 538c, and 538d of dielectric body 508. Dielectric body 608 can include at least one silicon nitride layer and at least one silicon oxide layer as dielectric layers. It should be noted that as with other implementations described herein, dielectric body 608 can include more or fewer dielectric layers than shown.

Gate arrangement 610 includes gate electrode 622 integrated with field plates 646 and 648 and corresponding respectively to gate electrode 522 and field plates 546 and 548 in FIGS. 5A and 5B. Thus, field plate 646 is a source-side field plate and field plate 648 is a drain-side field plate. Gate arrangement 610 also includes gate dielectric 644 corresponding to gate dielectric 544 in FIGS. 5A and 5B. While gate dielectric 644 is situated below gate well 620, similar to gate dielectric 544 in FIGS. 5A and 5B, in other implementations, gate dielectric 644 can be situated in and line gate well 620, similar to gate dielectric 124 in FIGS. 1A and 1B.

In III-nitride semiconductor device 600, field plate 646 includes steps 646a, 646b, 646c, and 646d corresponding respectively to steps 546a, 546b, 546c, and 546d of field plate 546. Thus, at least some of steps 646a, 646b, 646c, and 646d of field plate 646 may be defined by ledges 636a, 636b, 636c, and 636d of dielectric body 608. Furthermore, at least one of steps 646a, 646b, 646c, and 646d of field plate 646 may be defined by openings in dielectric body 608. Field plate 648 includes steps 648a, 648b, 648c, and 648d corresponding respectively to steps 548a, 548b, 548c, and 548d of field plate 548. Thus, at least some of steps 648a, 648b, 648c, and 648d of field plate 648 may be defined by ledges 638a, 638b, 638c, and 638d of dielectric body 608. Furthermore, at least one of steps 648a, 648b, 648c, and 648d of field plate 648 may be defined by openings in dielectric body 608.

Thus, III-nitride semiconductor device 600 is similar to III-nitride semiconductor device 500. However, while in III-nitride semiconductor device 500, fields plates 546 and 548 are symmetrical, in III-nitride semiconductor device 600, field plates 646 and 648 are asymmetrical.

As shown in FIG. 6A, field plate 646 (e.g. a source-side field plate) and field plate 648 (e.g. a drain-side field plate) each include steps being of widths such that field plate 648 is wider than field plate 646. As such, the breakdown voltage of III-nitride semiconductor device 600 may be further improved.

In III-nitride semiconductor device 600, at least one of steps 648a, 648b, 648c, and 648d of field plate 648 is wider than at least one of steps 646a, 646b, 646c, and 646d of field plate 646. Doing so allows for enhanced active area shaping in providing field plate 648 with a greater width than field plate 646. In the implementation shown, each one of steps 648a, 648b, 648c, and 648d of field plate 648 is wider than a corresponding one of steps 646a, 646b, 646c, and 646d of field plate 646. For example, step 648a (i.e. a closest of the steps of field plate 648 to gate electrode 622) is wider than step 646a. However, some of steps 648a, 648b, 648c, and 648d of field plate 648 are not wider than the corresponding one of steps 646a, 646b, 646c, and 646d of field plate 646 in other implementations.

Also in some implementations, at least some of steps 648a, 648b, 648c, and 648d of field plate 648 have different widths with respect to one another. For example, FIG. 6B shows steps 648a, 648b, 648c, and 648d of field plate 648 having widths 650a, 650b, 650c, and 650d, which are different with respect to one another. Doing so allows for enhanced active area shaping of III-nitride semiconductor device 600. It should be noted that at least some steps of a source-side and/or a drain-side field can have different widths with respect to one another in any of the implementations described herein without being limited to FIGS. 6A and 6B. Furthermore, this concept may be applied to III-nitride semiconductor devices having only a source-side field plate or only a drain-side field plate.

In some implementations, in field plate 648, ones of steps 648a, 648b, 648c, and 648d closer to ohmic electrode 612b (e.g. a drain electrode) of III-nitride semiconductor device 600 are wider than ones of steps 648a, 648b, and 648c within gate well 620 that are closer to gate electrode 622. Similarly, in implementations having field plate 646, ones of steps 646a, 646b, 646c, and 646d closer to ohmic electrode 612a (e.g. a source electrode) of III-nitride semiconductor device 600 may be wider than ones of steps 646a, 646b, and 646c within gate well 620 that are closer to gate electrode 622. Also, in some implementations, in field plate 648, a closest one of steps 648a, 648b, 648c, and 648d to gate electrode 622 (i.e. step 648a) has a smallest width of steps 648a, 648b, and 648c within gate well 620. Similarly, in field plate 646, a closest one of steps 646a, 646b, 646c, and 646d to gate electrode 622 (i.e. step 646a) has a smallest width of steps 646a, 646b, and 646c within gate well 620. It will be appreciated that many other configurations are possible.

Also, for various implementations described herein that utilize a dielectric body having multiple dielectric layers, at least one of the dielectric layers can be of a different thickness than another of the dielectric layers. This can further enhance active area shaping for a III-nitride semiconductor device. For example, FIG. 6B shows dielectric layers 608a, 608b, 608c, and 608d of dielectric body 608 having thicknesses 652a, 652b, 652c, and 652d respectively. In some implementations, a thicker one of dielectric layers 608a, 608b, 608c, and 608d is situated over a thinner one of dielectric layers 608a, 608b, 608c, and 608d. The thinner one of dielectric layers 608a, 608b, 608c, and 608d may be a closest of dielectric layers 608a, 608b, 608c, and 608d to III-nitride heterojunction 606, as shown. Also, a relative thickness of dielectric layers 608a, 608b, 608c, and 608d may increase with a distance to III-nitride heterojunction 606, as shown. It will be appreciated that other configurations are possible.

Figure 7:
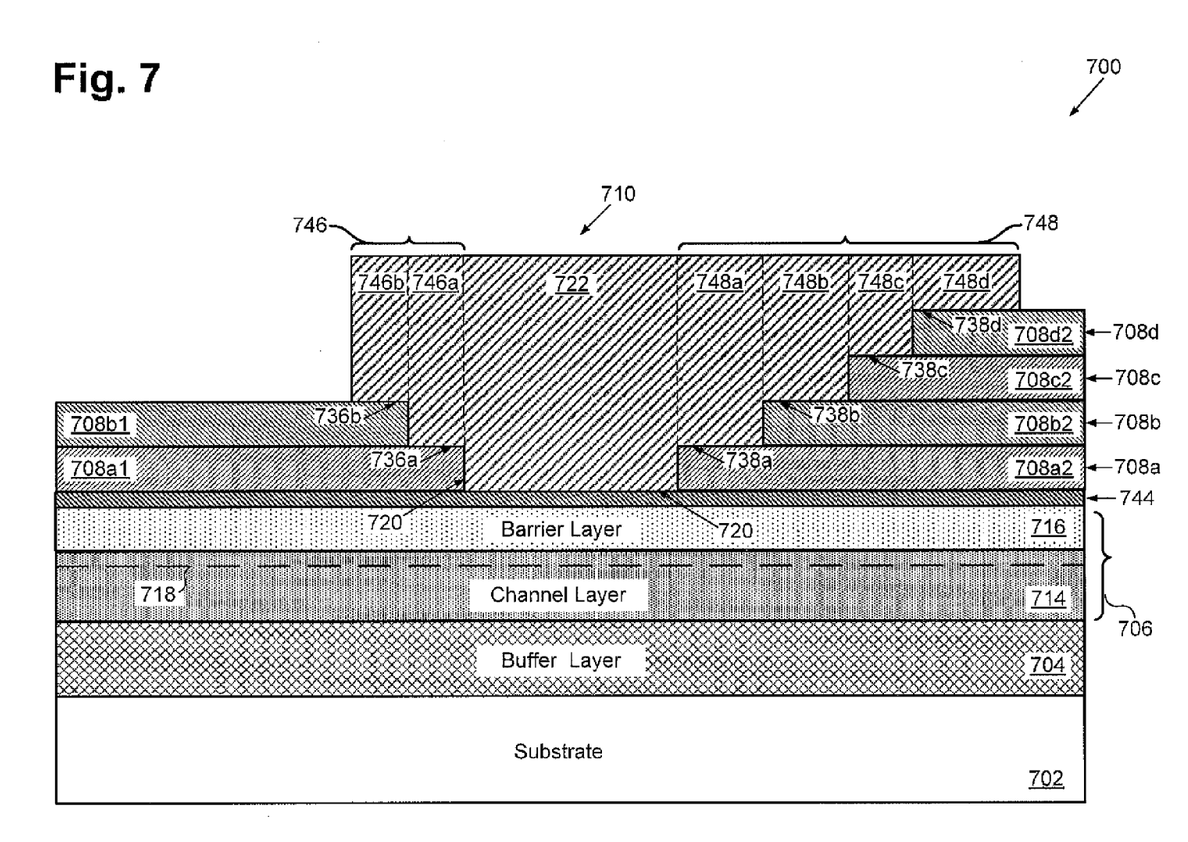
FIG. 7 presents a cross-sectional view of a portion of an exemplary III-nitride semiconductor device, in accordance with one implementation of the present disclosure.

In the implementations described above, a source-side field plate and a drain-side field plate, when present, include a same number of steps. In any of the implementations described herein, the source-side field plate may include a different number of steps than the drain-side field plate. Doing so allows for enhanced active area shaping of a III-nitride semiconductor device. FIG. 7 presents one such example where the source-side field plate includes a different number of steps than the drain-side field plate. FIG. 7 presents a cross-sectional view of a portion of an exemplary III-nitride semiconductor device, in accordance with one implementation of the present disclosure.

In FIG. 7, III-nitride semiconductor device 700 includes substrate 702, buffer layer 704, III-nitride heterojunction 706, dielectric body 708, gate arrangement 710, and gate well 720 corresponding respectively to substrate 602, buffer layer 604, III-nitride heterojunction 606, dielectric body 608, gate arrangement 610, and gate well 620 in FIGS. 6A and 6B. III-Nitride semiconductor device 700 also includes ohmic electrodes corresponding to ohmic electrodes 612a and 612b in FIGS. 6A and 6B, but are not shown so as to emphasize other features of III-nitride semiconductor device 700.

III-nitride heterojunction 706 is formed over buffer layer 704 and includes III-nitride body 716 situated over III-nitride body 714 to form a two-dimensional electron gas (2DEG) 718. III-nitride bodies 714 and 716 and 2DEG 718 correspond respectively to III-nitride bodies 614 and 616 and 2DEG 618 in FIGS. 6A and 6B.

Dielectric body 708 includes dielectric layers 708a, 708b, 708c, and 708d corresponding respectively to dielectric layers 608a, 608b, 608c, and 608d in dielectric body 608. Dielectric body 708 also includes ledges 736a and 736b corresponding respectively to ledges 636a and 636b of dielectric body 608. Dielectric body 708 further includes ledges 738a, 738b, 738c, and 738d corresponding respectively to ledges 638a, 638b, 638c, and 638d of dielectric body 608. Dielectric body 708 can include at least one silicon nitride layer and at least one silicon oxide layer as dielectric layers. It should be noted that as with other implementations described herein, dielectric body 708 can include more or fewer dielectric layers than shown.

Gate arrangement 710 includes gate electrode 722 integrated with field plates 746 and 748 and corresponding respectively to gate electrode 622 and field plates 646 and 648 in FIGS. 6A and 6B. Thus, field plate 746 is a source-side field plate and field plate 748 is a drain-side field plate. Gate arrangement 710 also includes gate dielectric 744 corresponding to gate dielectric 644 in FIGS. 6A and 6B. While gate dielectric 744 is situated below gate well 720, similar to gate dielectric 644 in FIGS. 6A and 6B, in other implementations, gate dielectric 744 can be situated in and line gate well 720, similar to gate dielectric 124 in FIGS. 1A and 1B.

In III-nitride semiconductor device 700, field plate 746 includes steps 746a and 746b, 646c corresponding respectively to steps 646a and 646b of field plate 646. Thus, at least some of steps 746a and 746b of field plate 746 may be defined by ledges 736a and 736b of dielectric body 708. Furthermore, at least one of steps 746a and 746b of field plate 746 may be defined by openings in dielectric body 708. Field plate 748 includes steps 748a, 748b, 748c, and 748d corresponding respectively to steps 648a, 648b, 648c, and 648d of field plate 648. Thus, at least some of steps 748a, 748b, 748c, and 748d of field plate 748 may be defined by ledges 738a, 738b, 738c, and 738d of dielectric body 708. Furthermore, at least one of steps 748a, 748b, 748c, and 748d of field plate 748 may be defined by openings in dielectric body 708.

Thus, III-nitride semiconductor device 700 is similar to III-nitride semiconductor device 600. However, while in III-nitride semiconductor device 600, field plate 648 has a same number of steps as field plate 646, in III-nitride semiconductor device 700, field plate 748 has a different number of steps than field plate 746. Doing so allows for enhanced active area shaping of III-nitride semiconductor device 700.

In III-nitride semiconductor device 700, dielectric layer 708a includes corresponding dielectric segments 708a1 and 708a2. Dielectric layer 708b includes corresponding dielectric segments 708b1 and 708b2. Thus, corresponding ones dielectric segments 708a1, 708a2, 708b1, and 708b2 are of a common dielectric layer. Furthermore, corresponding ones of steps 746a and 746b of field plate 746 and steps 748a and 748b of field plate 748 are situated on a common dielectric layer. Dielectric layers 708c and 708d include only dielectric segments 708c1 and 708d1 respectively.

Gate well 720 is defined by dielectric segments 708a1, 708b1, 708a2, 708b2, 708c2, and 708d2. Field plate 746 is situated in gate well 720 and over dielectric segments 708a1 and 708b1, which may also be referred to as source-side dielectric segments. Field plate 748 is situated in gate well 720 and over dielectric segments 708a2, 708b2, 708c2, and 708d2, which may also be referred to as drain-side dielectric segments. As can be seen in FIG. 7, field plate 748 is situated over a different number of dielectric segments than field plate 746. Doing so allows for enhanced active area shaping of III-nitride semiconductor device 700.

In some implementations, field plate 748 has more steps than field plate 746. Doing so can be effective in improving the breakdown voltage of III-nitride semiconductor device 700. In the present implementation, steps 746a, 746b, 748a, 748b, 748c, and 748d are defined by dielectric segments 708a1, 708b1, 708a2, 108b2, 708c2, and 708d2. As such, the foregoing may be achieved by situating field plate 748 over more dielectric segments of dielectric body 708 than field plate 746, as shown.

It is noted that in other implementations, field plate 746 has more steps than field plate 748 and field plate 746 may be situated over more dielectric segments of dielectric body 708 than field plate 748. Furthermore, in FIG. 7, each of steps 746a, 746b, 748a, 748b, 748c, and 748d are situated on a respective one of dielectric segments 708a1, 708b1, 708a2, 108b2, 708c2, and 708d2. However, in other implementations, more than one step may be situated on a common dielectric segment. Also, although corresponding ones of dielectric segments 708a1, 708b1, 708a2, 108b2, 708c2, and 708d2 are of a common dielectric layer, any of those dielectric segments may instead be of different dielectric layers. The same applies to any of the implementations described herein. Additionally, the number of dielectric segments may be varied from what is shown in FIG. 7.

Thus, as described above with respect to FIGS. 1A, 1B, 2, 3A, 3B, 3C, 4, 5A, 5B, 6A, 6B, and 7 implementations of the present disclosure can utilize a dielectric body to allow for III-nitride semiconductor devices with decreased overlap between a gate electrode and 2DEG, thereby reducing Qgd. Furthermore, high electric fields that would otherwise form from sharp corners of the gate electrode can be alleviated, thereby increasing breakdown voltage of the III-nitride semiconductor device. A source-side field plate and a drain-side field plate each including steps can be provided in the III-nitride semiconductor devices. The drain-side field plate can have a different number of steps than the source-side field plate so as to enhance active area shaping of the III-nitride semiconductor devices.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects, as illustrative and not restrictive. It should also be understood that the present application is not limited to the particular implementations described above, but many rearrangements, modifications, and substitutions are possible without departing from the scope of the present disclosure.

The invention claimed is:

1. A III-nitride semiconductor device comprising:
   a III-nitride heterojunction including a first III-nitride body situated over a second III-nitride body to form a two-dimensional electron gas;
   a gate well formed in a dielectric body, said dielectric body situated over said III-nitride heterojunction, said first III-nitride body being interposed between said dielectric body and said second III-nitride body;
   a gate arrangement situated in said gate well and comprising a gate electrode, a source-side field plate, and a drain-side field plate;
   said source-side field plate and said drain-side field plate each comprising one or more steps, wherein said drain-side field plate has a greater number of said one or more steps than said source-side field plate.

2. The III-nitride semiconductor device of claim 1, wherein said one or more steps are defined by said dielectric body.

3. The III-nitride semiconductor device of claim 1, wherein said one or more steps are defined by dielectric segments of said dielectric body.

4. The III-nitride semiconductor device of claim 1, wherein said one or more steps are defined by ledges of said dielectric body.

5. The III-nitride semiconductor device of claim 1, wherein said dielectric body comprises dielectric segments and said source-side field plate and said drain-side field plate are situated over said dielectric segments.

6. The III-nitride semiconductor device of claim 1, wherein corresponding ones of said one or more steps of said source-side field plate and said one or more steps of said drain-side field plate are situated on a common dielectric layer.

7. The III-nitride semiconductor device of claim 1, wherein said dielectric body comprises at least one silicon nitride layer and at least one silicon oxide layer.

8. The III-nitride semiconductor device of claim 1, wherein said source-side field plate and said drain-side field plate are integrated with said gate electrode.

9. The III-nitride semiconductor device of claim 1, wherein said drain-side field plate is wider than said source-side field plate.

10. A III-nitride semiconductor device comprising:
    a III-nitride heterojunction including a first III-nitride body situated over a second III-nitride body to form a two-dimensional electron gas;
    a gate well formed in a dielectric body, said dielectric body situated over said III-nitride heterojunction and comprising dielectric segments, said first III-nitride body being interposed between said dielectric body and said second III-nitride body;
    a gate arrangement situated in said gate well and comprising a gate electrode, a source-side field plate, and a drain-side field plate;
    said source-side field plate and said drain-side field plate each comprising one or more steps situated over said dielectric segments, wherein said drain-side field plate is situated over a greater number of said dielectric segments than said source-side field plate.

11. The III-nitride semiconductor device of claim 10, wherein said drain-side field plate has a different number of said one or more steps than said source-side field plate.

12. The III-nitride semiconductor device of claim 10, wherein said one or more steps are defined by said dielectric segments.

13. The III-nitride semiconductor device of claim 10, wherein a respective one of said one or more steps are situated on each of said dielectric segments.

14. The III-nitride semiconductor device of claim 10, wherein said source-side field plate is situated over source-side dielectric segments and said drain-side field plate is situated over drain side dielectric segments.

15. The III-nitride semiconductor device of claim 14, wherein corresponding ones of said source-side and drain-side dielectric segments are of a common dielectric layer.

16. The III-nitride semiconductor device of claim 10, wherein said drain-side field plate has more of said one or more steps than said source-side field plate.

17. The III-nitride semiconductor device of claim 10, wherein said gate well is defined by said dielectric segments.

18. The III-nitride semiconductor device of claim 10, wherein said drain-side field plate is wider than said source-side field plate.

19. The III-nitride semiconductor device of claim 10, wherein at least one of said dielectric segments comprises silicon nitride and at least another of said dielectric segments comprises silicon oxide.

* * * * *